United States Patent
Shinohara et al.

(10) Patent No.: US 7,641,967 B2
(45) Date of Patent: Jan. 5, 2010

(54) HEAT RESISTANT MASKING TAPE

(75) Inventors: Masaru Shinohara, Machida (JP); Yoong Kim, Ithaca, NY (US); Yorinobu Takamatsu, Sagamihara (JP); Harumi Ushito, Sagamihara (JP)

(73) Assignee: 3M Innovative Properties Company, St. Paul, MN (US)

( * ) Notice: Subject to any disclaimer, the term of this patent is extended or adjusted under 35 U.S.C. 154(b) by 149 days.

(21) Appl. No.: 10/561,358

(22) PCT Filed: Jun. 24, 2004

(86) PCT No.: PCT/US2004/020326
§ 371 (c)(1),
(2), (4) Date: Dec. 19, 2005

(87) PCT Pub. No.: WO2005/017059
PCT Pub. Date: Feb. 24, 2005

(65) Prior Publication Data
US 2007/0104972 A1    May 10, 2007

(30) Foreign Application Priority Data
Aug. 6, 2003  (JP) .............................. 2003-206343

(51) Int. Cl.
| | |
|---|---|
| B32B 27/30 | (2006.01) |
| B32B 7/12 | (2006.01) |
| B32B 27/04 | (2006.01) |
| B32B 27/08 | (2006.01) |
| B32B 27/36 | (2006.01) |
| B32B 27/38 | (2006.01) |
| C08L 33/00 | (2006.01) |
| C08L 63/00 | (2006.01) |

(52) U.S. Cl. .................. 428/355 AC; 428/355 EP; 428/413; 428/414; 428/473.5; 428/480; 428/500; 428/522

(58) Field of Classification Search .................. None
See application file for complete search history.

(56) References Cited

U.S. PATENT DOCUMENTS

| | | | |
|---|---|---|---|
| 3,284,423 A | | 11/1966 | Knapp |
| 3,729,338 A | | 4/1973 | Lehmann et al. |
| 4,038,454 A | * | 7/1977 | Lehmann et al. ............. 428/356 |
| 4,762,747 A | | 8/1988 | Liu et al. |
| H688 H | * | 10/1989 | Sobataka et al. ............. 204/165 |
| 5,229,206 A | * | 7/1993 | Groves ........................ 428/344 |
| 2001/0055679 A1 | | 12/2001 | Schumann et al. |
| 2002/0114948 A1 | * | 8/2002 | Schumann et al. ........... 428/352 |
| 2002/0132111 A1 | * | 9/2002 | Zhou et al. .................. 428/343 |
| 2003/0124346 A1 | * | 7/2003 | Yamanaka et al. ...... 428/355 AC |
| 2003/0145949 A1 | | 8/2003 | Tanaka et al. |

FOREIGN PATENT DOCUMENTS

| | | |
|---|---|---|
| EP | 1 167 483 A1 | 1/2002 |
| EP | 1 336 647 A2 | 8/2003 |
| JP | 05-163468 | 6/1993 |
| JP | 8283678 | 10/1996 |
| JP | 10-025456 | 1/1998 |
| JP | 2003165961 | 6/2003 |
| WO | WO 03/064552 A1 | 8/2003 |

* cited by examiner

*Primary Examiner*—Michael J Feely
(74) *Attorney, Agent, or Firm*—James A. Baker; Dean M. Harts

(57) ABSTRACT

A heat resistant masking tape, comprising (1) a heat resistant backing film layer; and (2) a pressure-sensitive adhesive layer disposed on the heat resistant backing film layer, wherein the pressure-sensitive adhesive layer comprises a polymer resulting from polymerizing and cross-linking a monomer mixture comprising an alkyl (meth)acrylate with an alkyl group having 4 to 15 carbon atoms, glycidyl (meth)acrylate and (meth) acrylic acid, the glycidyl (meth)acrylate being present in an amount of 2 to 13% by weight of the total weight of monomers and the (meth)acrylic acid being present in an amount of 1 to 7% by weight of the total weight of monomers.

6 Claims, 1 Drawing Sheet

HEAT RESISTANT MASKING TAPE

BACKGROUND

The present invention relates to a heat resistant masking material.

In general, a pressure-sensitive adhesive tape having a pressure-sensitive adhesive layer containing an acrylic polymer as a main component on backing layer is known. Because the acrylic pressure-sensitive adhesive is generally superior in weatherability. Particularly, in case the acrylic pressure-sensitive adhesive is crosslinked, it becomes possible to be provided with the heat resistance. An example of the crosslink-type acrylic adhesive is disclosed in U.S. Pat. No. 3,284,423. This crosslink-type acrylic adhesive contains (a) 35 to 75% by weight of an acrylate ester having 6 to 15 carbon atoms; (b) 10 to 60% by weight of methyl acrylate or ethyl acrylate; (c) 0.1 to 10% by weight of an acid component such as (meth)acrylic acid, itaconic acid, or crotonic acid; and (d) 0.1 to 10% by weight of glycidyl (meth)acrylate, and is self-crosslinked at room temperature or upon heating. As a result, the crosslink-type acrylic pressure-sensitive adhesive can have both a cohesive force and a holding force and a sufficiently high adhesive force at high temperature. Preferably, glycidyl (meth)acrylate is present in an amount of 1 to 3% by weight, thereby to impart a desired cohesive force to the above crosslink-type pressure-sensitive acrylic adhesive. This type of pressure-sensitive adhesive can maintain a high adhesive force even after cross-linking by using methyl acrylate or ethyl acrylate as a monomer component.

Further, Japanese Patent No. 2955095 discloses a pressure-sensitive adhesive for a surface protecting film, comprising a copolymer derived from copolymerizing (meth)acrylate ester monomer with a carboxylic group-containing copolymerizable monomer, the copolymer being cross-linked by an epoxy compound having two or more epoxy groups such as a polyglycidyl ether or polyglycidyl amine, wherein the pressure-sensitive adhesive after curing has a 10% modulus of 0.8 to 4.0 kgf/cm$^2$. It describes that the pressure-sensitive adhesive is used for protecting a surface of a resinous board. It further describes that it allows a high-speed release of the protecting film with the pressure-sensitive adhesive from the resinous board, by adjusting the modulus of adhesive to 0.8 kg/cm$^2$ or higher. However, it is very difficult to have two opposed properties of high initial adhesive strength and adhesive strength during use, and cohesive force enabling release of the adhesive after being used.

On the other hand, a pressure-sensitive adhesive is proposed, which is capable of providing a sufficient adhesion at time of use and capable of lowering its adhesion after use, whereby easily released or removed. Japanese Unexamined Patent Publication (Kokai) No. 10-25456 discloses a pressure-sensitive adhesive sheet, which can easily be released and removed upon heating. The pressure-sensitive adhesive disclosed in Japanese Unexamined Patent Publication (Kokai) No. 10-25456 generally comprises a pressure-sensitive adhesive layer containing 100 parts by weight of a tacky base polymer, 10 to 900 parts by weight of a thermosetting compound and 0.1 to 10 parts by weight of a thermal polymerization initiator. The base polymer of the pressure-sensitive adhesive sheet enables strong adhesion at the time of use. However, when the pressure-sensitive adhesive sheet is once heat-treated after use, the adhesive force is lowered and it becomes possible to easily release the pressure-sensitive adhesive sheet. The thermosetting compound is three-dimensionally crosslinked by heating to a temperature of 30 to 150° C. in the presence of the thermal polymerization initiator such as organic peroxide and thus lowering the adhesion of the pressure-sensitive adhesive sheet. Although a low-molecular compound or oligomer having at least two carbon-carbon double bonds is commonly used as the thermosetting compound, such a low-molecular compound or oligomer is likely to remain in the pressure-sensitive adhesive layer without being crosslinked, resulting in a residual of adhesive upon releasing. Further, since it is not cross-linked at time of use, the cohesive force is low and thus it cannot be repositioned. It is more likely to lower a cohesive force of the adhesive, resulting in a residual of adhesive, if the adhesive encounters severe conditions such as a plasma treatment.

In the field of masking tape etc. for lead frame used such as in manufacturing of chip-scale packaging, a pressure-sensitive adhesive tape capable of resisting the increasingly severe conditions is required. For example, a pressure-sensitive adhesive tape as a masking tape is required which has a sufficient initial adhesion to an adherent and a cohesive force for repositionability, has a stable adhesive strength at time of heat treatment at a high temperature for a long time and a plasma treatment, and later, can be easily released without a residual of adhesive.

SUMMARY

The present invention, in one embodiment, provides a heat resistant masking tape, comprising (1) a heat resistant backing film layer; and (2) a pressure-sensitive adhesive layer disposed on the heat resistant backing film layer, wherein the pressure-sensitive adhesive layer comprises a polymer resulting from polymerizing and cross-linking a monomer mixture comprising an alkyl (meth)acrylate with an alkyl group having 4 to 15 carbon atoms, glycidyl (meth)acrylate and (meth)acrylic acid, the glycidyl (meth)acrylate being present in an amount of 2 to 13% by weight of the total weight of monomers and the (meth)acrylic acid being present in an amount of 1 to 7% by weight of the total weight of monomers.

Figure 1A:
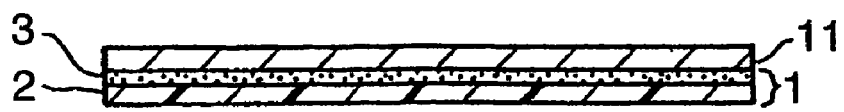
FIGS. 1*a*-1*f* show one embodiment of manufacturing process flow diagram of quad flat non-lead (QFN) chip scale package.

SYMBOLS 1 heat resistant masking tape
2 heat resistant backing film layer
3 pressure-sensitive adhesive layer
11 lead frame
12 die-bonding adhesive tape
13 semiconductor chip
14 sealing resin

DETAILED DESCRIPTION

A heat resistant masking tape having the specific pressure-sensitive adhesive layer can be repositionable, has a sufficient adhesion strength after application, does not release or increase adhesion strength such as by an action of heat treatment or plasma treatment, and can be released without residual of adhesive after use.

The term "(meth)acrylate" means acrylate or methacrylate, and the term "(meth)acrylic" means acrylic or methacrylic. Further, the term "heat resistant masking tape" is interpreted broadly to encompass a film, sheet, or tape.

The heat resistant masking tape of the present invention will be explained by way of preferred embodiments. It is to be understood by a person with ordinary skill in the art that the present invention is not limited to the embodiments.

The heat resistant masking tape of the present invention comprises a heat resistant backing film layer and a pressure-sensitive adhesive layer disposed on the heat resistant backing film layer. The heat resistant backing film layer supports the pressure-sensitive adhesive layer. The heat resistant backing film layer may support the acrylic pressure-sensitive adhesive layer only on one total surface or partial surface thereof, or may support the pressure-sensitive adhesive layer on both sides of total surfaces or partial surfaces thereof. Commonly, the material for the heat resistant backing film layer is appropriately selected, depending on what temperatures the masking tape encounters at time of use. For example, when the temperature encountered during the process is lower than 170° C., polyethylene terephthalate (PET) can be selected as a preferable heat resistant backing film layer. When the process temperature is 170 to 200° C., the preferable heat resistant backing film layer is a film of polyether imide, polyether sulfone, polyethylene naphthalate, or polyphenylene sulfide. Furthermore, when the process temperature is 200° C. or higher, the preferable heat resistant backing film layer is a film of polyether ether ketone, polyamideimide, or polyimide. Taking account of the availability and chemical stability, particularly, PET, polyethylene naphthalate, polyphenylene sulfide and polyimide are preferred because of high versatility. Taking account of the handling and availability, the heat resistant backing film layer preferably has a thickness of 1 to 250 μm.

The pressure-sensitive adhesive layer comprises a polymer resulting from polymerizing and cross-linking a monomer mixture comprising an alkyl (meth)acrylate with an alkyl group having 4 to 15 carbon atoms, glycidyl(meth)acrylate and (meth)acrylic acid. The polymerization is effected by a free-radical polymerization of carbon-carbon double bond in the acrylic monomers. The cross-linking is yielded by reaction of glycidyl group (epoxy group) in glycidyl(meth)acrylate with a carboxylic group in (meth)acrylic acid. The glycidyl(meth)acrylate is present in an amount of 2 to 13% by weight of the total weight of monomers and the (meth)acrylic acid is present in an amount of 1 to 7% by weight of the total weight of monomers. If the amount of glycidyl(meth)acrylate is less than 2% by weight or the amount of (meth)acrylic acid is less than 1% by weight, heat resistance of the pressure-sensitive adhesive becomes low and a residual adhesive may be left on the adherent after heat treatment. On the other hand, if the amount of glycidyl(meth)acrylate is more than 13% by weight or the amount of (meth)acrylic acid is more than 7% by weight, adhesion force of the adhesive to the adherent is low and adhesive may be peeled at the time of use. From the views of a good balance between the adhesion force to the adherent and the cohesive force of the pressure-sensitive adhesive layer, glycidyl(meth)acrylate is more preferably contained in an amount of 2 to 10% by weight of the total weight of monomers and (meth)acrylic acid is more preferably contained in an amount of 1 to 5% by weight of the total weight of monomers The monomer mixture contains an alkyl (meth)acrylate with an alkyl group having 4 to 15 carbon atoms. More specifically, the alkyl (meth)acrylate with an alkyl group having 4 to 15 carbon atoms includes, for example, $C_{4-8}$ alkyl acrylate such as n-butyl acrylate, isobutyl acrylate, isooctyl acrylate, 2-ethylhexyl acrylate, 2-methylbutyl acrylate, isoamyl acrylate or n-octyl acrylate; $C_{8-15}$ alkyl methacrylate such as isooctyl methacrylate, 2-ethylhexyl methacrylate, dodecyl methacrylate and/or n-octyl methacrylate. Although the monomer mixture preferably consists of an alkyl (meth)acrylate with an alkyl group having 4 to 15 carbon atoms, glycidyl(meth)acrylate, and (meth)acrylic acid, it may further contain other monomers as long as the effect of the present invention is impaired. Examples of such comonomers may be (meth)acrylate having a glass transition temperature of 0° C. or more, and more specifically include alkyl (meth)acrylate such as methyl (meth)acrylate, ethyl methacrylate, n-butyl (meth)acrylate, isobornyl (meth)acrylate, stearyl (meth)acrylate, cyclohexyl (meth)acrylate or lauryl acrylate; hydroxyalkyl (meth)acrylate such as hydroxyethyl (meth)acrylate, hydroxypropyl (meth)acrylate or hydroxybutyl (meth)acrylate; and polar monomer such as acrylamide, dimethylaminoethyl (meth)acrylate, N-vinyl pyrrolidone, 2-hydroxy-3-phenoxypropyl acrylate, dimethylaminopropylamide, N,N-dimethylacrylamide, isopropylacrylamide, or N-methylolacrylamide.

The pressure-sensitive adhesive layer preferably has a thickness of 0.5 to 100 μm. When the pressure-sensitive adhesive layer has a thickness of less than 0.5 μm, the resulting film hardly conforms to the adherent when contacted with it and are likely to be released during use. On the other hand, when the pressure-sensitive adhesive layer has a thickness of more than 100 μm, it becomes hard to sufficiently remove the solvent after coating of the pressure-sensitive adhesive layer or foaming may occur when the adhesive layer is heat-treated.

In case the adhesion (anchoring property) between the heat resistant backing film layer and the pressure-sensitive adhesive layer is poor, delamination sometime occurs between the heat resistant backing film layer and the pressure-sensitive adhesive layer upon releasing the heat resistant masking tape from the adherent. In that case, one surface of the thermally resistant backing film layer may be subjected to a surface treatment for easy bonding using conventionally known technique in order to improve the anchoring property with the pressure-sensitive adhesive layer. Preferred example of the surface treatment is a physical treatment such as corona discharge treatment, flame treatment, plasma treatment, or ultraviolet irradiation treatment; or a wet chemical treatment. A corona discharge treatment is particularly preferred. Because the heat resistant backing film layer subjected to the corona discharge treatment is commercially available and easily available.

In case the surface treatment is hardly conducted or the anchoring property is poor even after the surface treatment, a primer treatment may be conducted to further improve the anchoring property. The primer treatment refers to a treatment of providing a coating layer (primer layer) having excellent adhesion with both the heat resistant backing film layer and the pressure-sensitive adhesive layer, on the heat resistant backing film layer, and the pressure-sensitive adhesive layer can be provided on the primer layer. In that case, the thickness of the primer layer is preferably 0.1 to 2 μm. When the thickness of the primer layer is 0.1 μm or less, its effect cannot be expected. On the other hand, when the thickness is 2 μm or more, the solvent or chemical penetrates and delamination of the heat resistant masking tape and contamination of the adherent are likely to occur.

The surface of the heat resistant backing film layer opposite to the side on which the pressure-sensitive adhesive layer is disposed, may be subjected to a release treatment. When the opposite side surface is subjected to the release treatment, the heat resistant masking tape of the present invention can be stored in the form of a rolled tape. As a release agent for release treatment, for example, a silicone release agent, a fluorine release agent, a (meth)acrylic release agent having a long-chain alkyl group and a vinyl ether release agent having a long-chain alkyl group can be used.

As far as the object and effect of the present invention are not adversely affected, the pressure-sensitive adhesive layer may contain additives such as antioxidants, ultraviolet absorbers, fillers (for example, inorganic fillers, conductive particles or pigments), lubricants such as waxes, tackifiers, plasticizers, curing accelerators and fluorescent dyes.

Next, An example of a method for preparing the above described heat resistant masking tape will be explained.

First, the above monomer mixture is polymerized. The monomer mixture can be radically polymerized in the presence of a polymerization initiator based on an azo compound or a peroxide. As the polymerization method, conventionally known polymerization methods such as solution polymerization method, emulsion polymerization method, suspension polymerization method and bulk polymerization method or the like can be used. Among these methods, the solution polymerization method is particularly preferred because a pressure-sensitive adhesive layer can be easily formed on the heat resistant backing film layer by coating and drying a solution containing the resulting polymer after polymerization. The solution polymerization is usually conducted in a nitrogen atmosphere at the polymerization temperature of 30 to 80° C. for the polymerization time of 1 to 24 hours. The polymer prepared as described above is dissolved in an organic solvent to prepare a coating solution. As the organic solvent, ethyl acetate, methyl ether ketone (MEK), toluene, or a mixture thereof can be commonly used. Then, the coating solution is uniformly coated on the heat resistant backing film layer by a die coating method, a knife coating method, a bar coating method, or other conventionally known coating methods. Since most of the coating solution is made only from the above polymer and a solvent, it can easily realize uniform coating. Then, the solvent is removed by drying the coating solution, together with the heat resistant backing film layer. Then, cross-linking of the polymer is effected by heating the polymer on the heat resistant backing film layer. The drying step can also function as cross-linking step by heating at temperature of lower than 100° C. or lower. Alternatively, cross-linking is preliminarily effected during the drying step and then proceeded additionally during an additional heating step. Cross-linking is occurred by reaction between a glycidyl group and carboxylic group in the polymer. However, cross-linking is not necessarily completely finished.

For example, a sufficient adhesive strength, and releasability after use can be obtained by proceeding the reaction at temperature of 60 to 100° C. for several hours to about three days. As described above, the heat resistant masking tape of the present invention can be prepared.

Figure 1B:
Figure 1C:
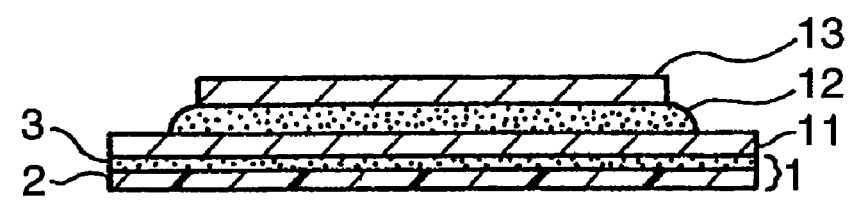
Figure 1D:
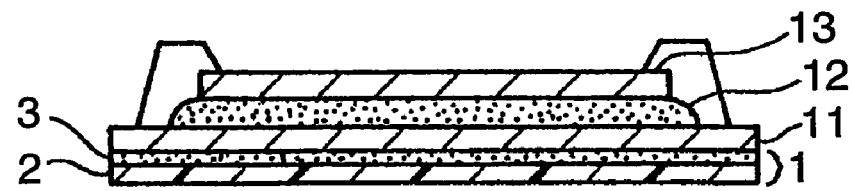
Figure 1E:
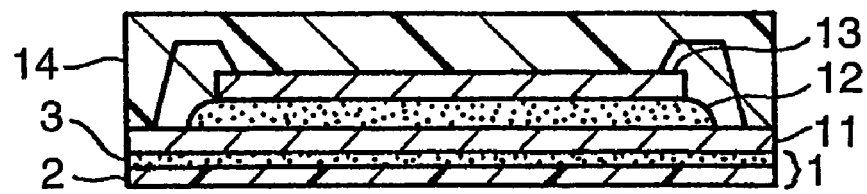
Figure 1F:
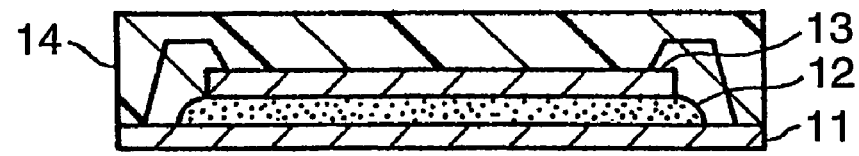

The heat resistant masking tape of the present invention is useful as a masking tape which is laminated to a copper substrate or nickel-palladium alloy substrate for preventing a leakage of epoxy molding compound when a semiconductor chip on a lead frame is to be covered by molding. FIG. 1 illustrates a process flow diagram for preparing a Quad Flat Nonlead (QFN) chip scale packaging. First, the heat resistant masking tape 1 of the present invention having a pressure-sensitive adhesive layer 3 on the heat resistant backing film layer 2 is prepared. The heat resistant masking tape 1 and a lead frame 11 are laminated so that the backside of the lead frame 11 is in contact with the pressure-sensitive adhesive layer 3 of the masking tape 1 (step (a)). Thus, the molding compound is prevented from flowing from the lead frame 11 to the backside thereof through the openings of the lead frame 11 in later steps.

Next, the lead frame 11 is cleaned by plasma treatment such as argon plasma, argon/oxygen plasma, argon/hydrogen plasma, argon/nitrogen plasma in order to remove contaminants adhered on the lead frame 11 (step (b)). At this time, although the plasma bombards the pressure-sensitive adhesive layer 3 of the masking tape 1 of the present invention through the openings of the lead frame, the pressure-sensitive adhesive layer 3 of the masking tape 1 will not be released or will not occur an excessive increase in adhesion strength.

Next, a die-bonding adhesive tape 12 is coated on the lead frame 11, a semiconductor chip 13 is mounted thereon, and the die-bonding adhesive tape 12 is cured with heating (step (c)). The die-bonding adhesive tape 12 is typically an epoxy-based thermosetting adhesive and is cured by treating at a temperature of 180 to 240° C. for about a few minutes to one hour.

After plasma cleaning as carried out in step (b), wire-bonding is effected (step (d)). The wire-bonding is typically to electrically connect an electrode pad on the chip to the leads, by a metal wire such as gold wire. The wire-bonding effected by melting a metal wire such as gold wire by, for example, spark and hot-pressing it onto the electrode on the chip. During this process, the laminate may be heated to 180° C. to 210° C. and in some cases, 200° C. to 240° C.

After this, a resin-sealing step is effected by using an over-molding compound (step (e)). The over-molding compound is, for example, an epoxy-based thermosetting resin. The fluidized resin is cured to a sealing resin 14 by heating it to about 160 to 240° C.

Next, the masking tape 1 attached to the lead frame 11 is released (step (f)). The properties of masking tape 1 of the present invention are not lowered by high temperature heat treatment and plasma treatment, and the tape retains stable adhesion strength. As a result, it is not delaminated and does not occur an excessive increase in adhesion strength. It does not leave adhesive residuals upon releasing on the lead frame 11, due to sufficiently low adhesion strength for releasing and sufficiently high cohesive strength of the adhesive.

After releasing a masking tape 1, usual procedures may be done to the resulting body. For example, it is solder plated, fixed on the dicing-tape and diced into individual packages.

EXAMPLES

The present invention will be explained by way of examples. It is to be understood by a person with an ordinary skill in the art that the present invention is not limited to the examples.

Examples 1 to 3 and Comparative Examples 1 to 6

1. Synthesis of Acrylic Copolymer and Preparation of Pressure-Sensitive Adhesive Precursor Solution An acrylic copolymer having the following composition ratio as shown in the following Table 1 was prepared in ethyl acetate solution at solid contents of 30%. As an initiator, V-65 was used in an amount of 0.25% by weight based on the monomers. Polymerization was effected at 50° C. in a water bath for 20 hours after nitrogen purging.

TABLE 1

|  | Composition | (% by weight) |
| --- | --- | --- |
| Solution 1 | BA/AA/GMA | 97.07/0.98/1.94 |
| Solution 2 | BA/AA/GMA | 94.28/1.92/3.80 |

TABLE 1-continued

| | Composition | (% by weight) |
|---|---|---|
| Solution 3 | BA/AA/GMA | 88.98/3.70/7.34 |
| Solution 4 | BA/AA/GMA | 79.46/6.90/13.64 |
| Solution 5 | BA/AA/GMA | 96.1/1.96/1.94 |
| Solution 6 | 2EHA/MA/AA/GMA | 60/34/5/1 |
| Solution 7 | 2EHA/EA/AA/GMA | 64/30/5/1 |
| Solution 8 | BA/AA | 98/2 |
| | Symbols and Manufacturers | |
| BA | butyl acrylate, from Mitsubishi Chemical Corporation (acrylic acid butyl ester) | |
| 2EHA | 2-ethylhexyl acrylate, from Wako Pure Chemical Industries Ltd. | |
| MA | methyl acrylate, from Wako Pure Chemical Industries Ltd. | |
| EA | ethyl acrylate, from Wako Pure Chemical Industries Ltd. | |
| GMA | glycidyl methacrylate, from NOF Corporation (Nissan blemer G) | |
| AA | acrylic acid, from Wako Pure Chemical Industries Ltd. | |
| V-65 | polymerization initiator, from Wako Pure Chemical Industries Ltd. | |

Next, the resulting solutions as described above were formulated with a cross-linking agent as shown in the following Table 2 to prepare pressure-sensitive adhesive precursor solutions. 2.0 parts of an anti-oxidation agent, Irganox 1330 from Ciba Specialty Chemicals relative to 100 parts of solids of the pressure-sensitive adhesive was added in all the solutions, and the solutions are adjusted to solid contents of 20% by methyl ethyl ketone (MEK).

TABLE 2

| | Solutions | Cross-Linking Agents |
|---|---|---|
| Ex. 1 | Solution 2 | none |
| Ex. 2 | Solution 3 | none |
| Ex. 3 | Solution 5 | none |
| Comp. Ex. 1 | Solution 1 | none |
| Comp. Ex. 2 | Solution 4 | none |
| Comp. Ex. 3 | Solution 6 | none |
| Comp. Ex. 4 | Solution 7 | none |
| Comp. Ex. 5 | Solution 8 | R789 equivalent to acrylic acid |
| Comp. Ex. 6 | Solution 8 | E-AX equivalent to acrylic acid |

Trade names and Manufactures
R789; bisamide cross-linking agent, 5% solution, from 3M Company
E-AX; epoxy cross-linking agent, 5% solution, from Soken Chemical K.K.

2. Preparation of Masking Tape

A 25 μm polyimide film (Toray Dow, Kapton 100V) was coated with pressure-sensitive adhesive precursor solutions obtained in the above Item 1, dried in an oven at 100° C. for 5 minutes and laminated to a silicone-treated polyethylene terephthalate (PET) film (Teijin Dupont Co. Ltd., Purex A50, 50 μm). Coating thickness was adjusted so that coating thickness after drying becomes 5 μm. Further, post curing was performed in an oven at 65° C. for 3 days to accelerate cross-linking reaction. Thus, masking tapes having a 5 μm pressure-sensitive adhesive layer on the 25 μm polyimide heat resistant backing film were prepared.

3. Measurements of Initial Adhesion Strength and Adhesion Strength After Heat Treatment The sample obtained in the above Item 2 was slit into ones having a width of 25 mm and each of them was press-adhered to a copper plate (C1100, 1 mm thickness, from Nippon Tact K.K.) with 2 kg roller once being rolled back and forward. The press-adhered sample was left at room temperature for 20 minutes and its 90° peel adhesion strength was measured on a tensilon. The measurement was performed at a measurement rate of 300 mm/min at 25° C. This is called "initial adhesion strength".

Adhesion strength after heat treatment was measured after the sample was press-adhered to the panel, was left in an oven at 200° C. for 60 minutes, and left at room temperature for 1 hour. The unit of adhesion strength is N/25 mm for all the cases.

The result of adhesion strength test was summarized in Table 3.

TABLE 3

| | Initial Adhesion Strength | Adhesion Strength After Heat Treatment |
|---|---|---|
| Ex.1 | 1.2 | 1.4 |
| Ex.2 | 1.2 | 1.6 |
| Ex.3 | 1.7 | 2.4 |
| Comp. Ex. 1 | 1.6 | 1.6 |
| Comp. Ex. 2 | 0.7 | 1.2 |
| Comp. Ex. 3 | 3.7 | 6.3 |
| Comp. Ex. 4 | 3.3 | 5.3 |
| Comp. Ex. 5 | 0.1 | 1.2 |
| Comp. Ex. 6 | 0.2 | 2.0 |

From Table 3, Examples 1, 2, and 3, and Comp. Ex. 1 and 2 have sufficient initial adhesion strengths to an adherend and they are easy to be released from the adherend, since they do not significantly increase adhesion strength after heat treatment.

4. Application Test

The conditions encountered in the lead frame masking application used in the manufacturing of Quad Flat Non-Lead chip scale packages were simulated. Evaluation was made by the following processes in order to check leakage of molding resin and adhesive residual upon release of tape. As a substrate, nickel-palladium alloy substrate was used.

Step 1 (Attachment of Masking Tape to Lead Frame): The masking tape was laminated to the nickel-palladium alloy lead frame so as not to incorporate bubbles between them.

Step 2 (Plasma Cleaning): The resulting laminate was cleaned by argon plasma for 10 minutes. Specifically, the conditions of treatment were at argon gas flow rate of 20 sccm, filament electric current of 190A (ampere), arc current 40A (ampere), and plasma deflection of 62.5% with LFC150 from Balzers.

Step 3 (Die-bonding of Chip on Leadframe): In order to simulate a heat curing of a die-attach epoxy, the laminate was heat treated at 200° C. for 60 minutes.

Step 4 (Plasma Cleaning): Argon plasma cleaning was done with the same conditions as in the above Step 2.

Step 5 (Wire-Bonding): In order to simulate wire-bonding, the laminate was heat treated at 200° C. for 20 minutes.

Step 5 (Resin Sealing): Molding was done with an epoxy molding compound. Molding was done at 175° C. for 2 minutes.

Step 6 (Release): The tape was peeled at 90° direction at a rate of 300 mm/min.

Step 7 (Observation): The tape peeled surface of the lead frame was observed by a microscope.

The results were summarized in Table 4.

TABLE 4

| | Leakage of Molding Resin | Adhesive Residual |
|---|---|---|
| Ex. 1 | None | None |
| Ex. 2 | None | None |
| Ex. 3 | None | None |
| Comp. Ex. 1 | None | Residual |
| Comp. Ex. 2 | Leakage | None |
| Comp. Ex. 3 | None | Residual |
| Comp. Ex. 4 | None | Residual |
| Comp. Ex. 5 | Leakage | Residual |
| Comp. Ex. 6 | Leakage | None |

From Table 4, Examples 1, 2, and 3 have sufficient initial strength in order to protect the adherend by inhibiting leakage of epoxy molding compound during heat treatment. Further, they have sufficient cohesion strength so that the tape could released from the adherend without leaving adhesive residuals even after heat treatment step at 200° C. or higher for 1 hour or more and cleaning step by plasma.

What is claimed is:

1. A heat resistant masking tape, comprising: (1) a heat resistant backing film layer; and (2) a pressure-sensitive adhesive layer disposed on the heat resistant backing film layer, wherein the pressure-sensitive adhesive layer comprises a partially or fully cross-linked polymer resulting from: (a) polymerizing a polymerizable solution to yield a polymer dissolved in an organic solvent, said polymerizable solution consisting essentially of a polymerization initiator and a monomer mixture consisting of three distinct monomers in said organic solvent, the monomer mixture consisting of an alkyl (meth)acrylate monomer with an alkyl group having 4 to 15 carbon atoms, a glycidyl(meth)acrylate monomer and a (meth)acrylic acid monomer, the glycidyl(meth)acrylate monomer being present in an amount of 2 to 13% by weight of the total weight of monomers, the (meth)acrylic acid monomer being present in an amount of 1 to 7% by weight of the total weight of monomers, and the alkyl (meth)acrylate monomer accounting for a balance of the total weight of monomers; (b) removing said solvent by drying; and (c) at least partially cross-linking said polymer by drying and optionally with additional heating, causing a reaction between a glycidyl group and carboxylic group in said polymer.

2. The heat resistant masking tape according to claim 1, wherein said pressure-sensitive adhesive layer has a thickness of 0.5 to 100 μm.

3. The heat resistant masking tape according to claim 1, wherein said heat resistant backing film layer is selected from the group consisting of polyethylene terephthalate, polyethylene naphthalate, polyphenylene sulfide, and polyimide.

4. The heat resistant masking tape according to claim 1, wherein said heat resistant backing layer has a thickness of 1 to 250 μm.

5. The heat resistant masking tape according to claim 1, wherein a first surface of the heat resistant backing film layer is surface treated.

6. The heat resistant masking tape according to claim 5, wherein a second surface of the heat resistant backing film layer opposite the first surface is treated with a release agent.

* * * * *